United States Patent
Chung et al.

(10) Patent No.: US 7,778,097 B2
(45) Date of Patent: Aug. 17, 2010

(54) AC COUPLING CIRCUITS INCLUDING RESISTIVE FEEDBACK AND RELATED METHODS AND DEVICES

(75) Inventors: Daehyun Chung, Daejeon (KR); Sihong Kim, Gyeonggi-do (KR); Jingook Kim, Gyeonggi-do (KR); Kwangil Park, Gyeonggi-do (KR); Seungjun Bae, Daejeon (KR); Jaehyung Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 177 days.

(21) Appl. No.: 12/142,085

(22) Filed: Jun. 19, 2008

(65) Prior Publication Data

US 2009/0179700 A1 Jul. 16, 2009

(30) Foreign Application Priority Data

Jan. 16, 2008 (KR) ............... 10-2008-0005043

(51) Int. Cl.
*G11C 7/00* (2006.01)
(52) U.S. Cl. ............ 365/207; 365/189.05; 365/233
(58) Field of Classification Search ........ 365/207, 365/189.05, 233; 330/69, 85, 107
See application file for complete search history.

(56) References Cited

U.S. PATENT DOCUMENTS 4,242,741 A * 12/1980 Parrish .................. 367/21
6,201,442 B1 * 3/2001 James et al. ............. 330/107
6,327,217 B1 12/2001 Chung
6,411,161 B1 * 6/2002 Yamamoto ............... 330/85

OTHER PUBLICATIONS

Menolfi et al. "A 16Gb/s Source-Series Terminated Transmitter in 65nm SOI" IBM Research GmbH, Zurich Research Laboratory, Ruschlikon, Switzerland, IEEE International Solid-State Circuits Conference, 2007.

* cited by examiner

*Primary Examiner*—Son Dinh
(74) *Attorney, Agent, or Firm*—Myers Bigel Sibley & Sajovec, P.A.

(57) ABSTRACT

An integrated circuit device may include an amplifier having an amplifier input configured to receive an input signal with the amplifier being configured to provide an amplifier output signal at an amplifier output responsive to the input signal received at the amplifier input. A capacitor may be coupled to the amplifier output, and a buffer may be coupled to the capacitor so that the capacitor is coupled in series between the amplifier output and an input of the buffer with an output of the buffer being coupled to a buffered signal terminal. A variable resistive feedback circuit may be coupled between the input and output of the buffer with the variable resistive feed back circuit providing a variable resistance between the input and output of the buffer. A feedback resistance controller may be coupled to the variable resistive feedback circuit with the feedback resistance controller being configured to select a first resistance for the variable resistive feedback circuit for a first frequency of the input signal and to select a second resistance for the variable resistive feedback circuit for a second frequency of the input signal different than the first frequency with the first and second resistances being different.

26 Claims, 9 Drawing Sheets

US 7,778,097 B2

AC COUPLING CIRCUITS INCLUDING RESISTIVE FEEDBACK AND RELATED METHODS AND DEVICES

RELATED APPLICATIONS

This U.S. non-provisional patent application claims the benefit of priority under 35U.S.C. §119 of Korean Patent Application No. 10-2008-0005043, filed on Jan. 16, 2008, the disclosure of which is hereby incorporated herein by reference in its entirety.

FIELD OF THE INVENTION

The present invention generally relates to electronics, and more particularly, to AC coupling circuits and related methods.

BACKGROUND

An AC (alternating current) coupling buffer of an integrated circuit device may be used to receive an AC signal from outside the integrated circuit device and to buffer the signal for use inside the integrated circuit device. An AC coupling buffer, for example, may be used to receive a differential clock signal from outside an integrated circuit memory device and to buffer the differential clock signal for use inside the integrated circuit memory device. More particularly, the buffered differential clock signal may be coupled to input/output buffers of the memory device, and the input/output buffers may be configured to write data to and/or read data from a memory cell array responsive to the buffered differential clock signal.

SUMMARY

According to some embodiments of the present invention, an integrated circuit device may include an amplifier including an amplifier input configured to receive an input signal with the amplifier being configured to provide an amplifier output signal at an amplifier output responsive to the input signal received at the amplifier input.

A capacitor may be coupled to the amplifier output, and a buffer may be coupled to the capacitor so that the capacitor is coupled in series between the amplifier output and an input of the buffer with an output of the buffer being coupled to a buffered signal terminal. A variable resistive feedback circuit may be coupled between the input and output of the buffer with the variable resistive feed back circuit providing a variable resistance between the input and output of the buffer. A feedback resistance controller may be coupled to the variable resistive feedback circuit with the feedback resistance controller being configured to select a first resistance for the variable resistive feedback circuit for a first frequency of the input signal and to select a second resistance for the variable resistive feedback circuit for a second frequency of the input signal different than the first frequency with the first and second resistances being different.

The amplifier may be a differential amplifier, the amplifier output signal may be a first differential amplifier output signal, and the amplifier output may be a first differential amplifier output. The differential amplifier may be configured to provide the first differential amplifier output signal and a second differential amplifier output signal respectively at the first differential amplifier output and at a second differential amplifier output responsive to the input signal received at the amplifier input. The capacitor may be a first capacitor, the buffer may be a first buffer, the variable resistive feedback circuit may be a first variable resistive feedback circuit, and the buffered signal terminal may be a first buffered signal terminal. In addition, a second capacitor may be coupled to the second differential amplifier output, and a second buffer may be coupled to the second capacitor so that the second capacitor is coupled in series between the second differential amplifier output and an input of the second buffer with an output of the second buffer being coupled to a second buffered signal terminal. A second variable resistive feedback circuit may be coupled between the input and output of the second buffer with the second variable resistive feed back circuit providing a variable resistance between the input and output of the second buffer. The feedback resistance controller may be coupled to the first and second variable resistive feedback circuits with the feedback resistance controller being configured to select a third resistance for the second variable resistive feedback circuit for the first frequency of the input signal and to select a fourth resistance for the second variable resistive feedback circuit for the second frequency of the input signal with the third and fourth resistances being different. For example, the first and third resistances may be the same and the second and fourth resistances may be the same.

The amplifier input may be a first differential amplifier input, the differential amplifier may include a second differential amplifier input, and the first and second differential amplifier inputs may be configured to receive complimentary differential clock signals. A signal input pad may be configured to receive the input signal from outside the integrated circuit device with the amplifier input being coupled to the signal input pad.

The signal input pad may include a clock signal input pad, and the input signal may include an input clock signal received from outside the integrated circuit device so that a buffered clock signal is provided at the buffered signal terminal. In addition, a memory cell array may include a plurality of memory cells, and a plurality of data input/output buffers may be coupled between respective data input/output pads and the memory cell array. Moreover, each of the data input/output buffers may be configured to write and/or read data to and/or from the memory cell array responsive to the buffered clock signal. The first resistance may be lower than the second resistance, and the first frequency may be higher than the second frequency.

A second resistive feedback circuit may be coupled between terminals of the capacitor. More particularly, the second resistive feedback circuit may include a second variable resistive feedback circuit providing a variable feedback resistance between terminals of the capacitor, and the feedback resistance controller may be coupled to the second variable resistive feedback circuit. The feedback resistance controller may be configured to select a third resistance for the second variable resistive feedback circuit for the first frequency of the input signal and to select a fourth resistance for the second variable resistive feedback circuit for the second frequency of the input signal with the third and fourth resistances being different.

The buffer may be an inverter, a latch may be coupled in series between the output of the buffer and the buffered signal terminal, and the variable resistive circuit may be a variable resistor. The variable resistive circuit may include a first resistor coupled between the input and output of the buffer and a switch coupled in series with a second resistor between the input and output of the buffer. Moreover, the switch may be configured to couple and decouple the second resistor responsive to the feedback resistance controller.

According to other embodiments of the present invention, an integrated circuit device may include an amplifier including an input configured to receive an input signal with the amplifier being configured to provide an amplifier output signal at an amplifier output responsive to the input signal received at the amplifier input. A capacitor may be coupled to the amplifier output, and a buffer may be coupled to the capacitor so that the capacitor is coupled in series between the amplifier output and an input of the buffer with an output of the buffer being coupled to a buffered signal terminal. A resistive feedback circuit may be coupled between terminals of the capacitor.

The amplifier may be a differential amplifier, the amplifier output signal may be a first differential amplifier output signal, and the amplifier output may be a first differential amplifier output. The differential amplifier may be configured to provide the first differential amplifier output signal and a second differential amplifier output signal respectively at the first differential amplifier output and at a second differential amplifier output responsive to the input signal received at the amplifier input. The capacitor may be a first capacitor, the buffer may be a first buffer, the variable resistive feedback circuit may be a first variable resistive feedback circuit, and the buffered signal terminal may be a first buffered signal terminal. In addition, a second capacitor may be coupled to the second differential amplifier output, and a second buffer may be coupled to the second capacitor so that the second capacitor is coupled in series between the second differential amplifier output and an input of the second buffer with an output of the second buffer being coupled to the buffered signal terminal. A second resistive feedback circuit may be coupled between terminals of the second capacitor. Moreover, the amplifier input may include a first differential amplifier input, the differential amplifier may include a second differential amplifier input, and the first and second differential amplifier inputs may be configured to receive complimentary differential clock signals.

A signal input pad may be configured to receive an input signal from outside the integrated circuit device with the amplifier input being coupled to the signal input pad. The signal input pad may include a clock signal input pad, and the input signal may include an input clock signal received from outside the integrated circuit device so that a buffered clock signal is provided at the buffered signal terminal. In addition, a memory cell array may include a plurality of memory cells, and a plurality of data input/output buffers may be coupled between respective data input/output pads and the memory cell array with each of the data input/output buffers being configured to write and/or read data to and/or from the memory cell array responsive to the buffered clock signal.

The resistive feedback circuit may include a variable resistive feedback circuit, and a feedback resistance controller may be coupled to the variable resistive feedback circuit. The feedback resistance controller may be configured to select a first resistance for the variable resistive feedback circuit for a first frequency of the input signal and to select a second resistance for the variable resistive feedback circuit for a second frequency of the input signal different than the first frequency with the first and second resistances being different.

A variable resistive feedback circuit may be coupled between the input and output of the buffer with the variable resistive feed back circuit providing a variable resistance between the input and output of the buffer. A feedback resistance controller may be coupled to the variable resistive feedback circuit with the feedback resistance controller being configured to select a first resistance for the variable resistive feedback circuit for a first frequency of the input signal and to select a second resistance for the variable resistive feedback circuit for a second frequency of the input signal different than the first frequency with the first and second resistances are different. More particularly, the first resistance may be lower than the second resistance with the first frequency being higher than the second frequency. The buffer may be an inverter, and a latch may be coupled in series between the output of the buffer and the buffered signal terminal.

According to still other embodiments of the present invention, a method of operating an integrated circuit device may include amplifying an input signal to provide an amplified output signal, and coupling the amplified output signal to an input terminal of a capacitor. The amplified output signal may be buffered at an output terminal of the capacitor to provide a buffered output signal, and a variable resistive feedback path may be provided for the buffered output signal to the output terminal of the first capacitor with a resistance of the first variable resistive feedback path being different for different frequencies of the clock signal.

The amplified output signal may be a first differentially amplified output signal, the capacitor may be a first capacitor, the amplified output signal may be a first differentially amplified output signal, and the variable resistive feedback path may be a first variable resistive feedback path. The buffered output signal may be a first buffered differential output signal, and amplifying the input signal may include differentially amplifying the input signal to provide the first differentially amplified output signal and a second differentially amplified output signal. In addition, the second differentially amplified output signal may be coupled to an input terminal of a second capacitor, and the second differentially amplified output signal may be buffered at an output terminal of the second capacitor to provide a second buffered differential output signal. A second variable resistive feedback path for the second buffered differential output signal may be provided to the output terminal of the second capacitor with a resistance of the second variable resistive feedback path being different for different frequencies of the clock signal.

The integrated circuit device may include a signal input pad configured to receive an input signal from outside the integrated circuit device, and the input signal may be received at the signal input pad. Accordingly, amplifying the input signal may include amplifying the input signal received at the signal input pad. Moreover, the signal input pad may be a clock signal input pad, and the input signal may be an input clock signal so that a buffered clock signal is provided as the buffered output signal. The integrated circuit device may also include a memory cell array having a plurality of memory cells, and data may be written/read to/from the memory cell array responsive to the buffered clock signal.

Providing the variable resistive feedback path may include providing a first resistance for a first frequency of the input signal and providing a second resistance for a second frequency of the input signal with the first and second resistances being different and with the first and second frequencies being different. The first resistance may be lower than the second resistance and the first frequency may be higher than the second frequency. In addition, a second resistive feedback path may be provided between terminals of the capacitor, and buffering the amplified output signal may include inverting the amplified output signal.

According to yet other embodiments of the present invention, a method of operating an integrated circuit device may include amplifying an input signal to provide an amplifier output signal, and coupling the amplified output signal to an input terminal of a capacitor. The amplified output signal may be buffered at an output terminal of the capacitor to provide a buffered output signal, and a resistive feedback path may be provided between terminals of the capacitor.

The amplifier output signal may be a first differentially amplified output signal, the capacitor may be a first capacitor, the buffered output signal may be a first buffered differential output signal, and the resistive feedback path may be a first resistive feedback path. Amplifying the input signal may include differentially amplifying the input signal to provide the first differentially amplified output signal and a second differentially amplified output signal. The second differentially amplified output signal may be coupled to an input terminal of a second capacitor, and the second differentially amplified output signal may be buffered at an output terminal of the second capacitor to provide a second buffered differential output signal. A second resistive feedback path may be provided between terminals of the second capacitor.

The integrated circuit device may include a signal input pad configured to receive an input signal from outside the integrated circuit device, the input signal may be received at the signal input pad, and amplifying the input signal may include amplifying the input signal received at the signal input pad. Moreover, the signal input pad may be a clock signal input pad, and the input signal may be an input clock signal so that a buffered clock signal is provided as the buffered output signal. The integrated circuit device may also include a memory cell array having a plurality of memory cells, and data may be written/read to/from the memory cell array responsive to the buffered clock signal. A second resistive feedback path may be provided between the buffered output signal and the output of the capacitor.

Providing the resistive feedback path may include providing a variable resistive feedback path between the terminals of the capacitor with a resistance of the variable resistive feedback path being different for different frequencies of the input signal. Moreover, providing the variable resistive feedback path may include providing a first resistance for a first frequency of the input signal and providing a second resistance for a second frequency of the input signal with the first and second resistances being different and with the first and second frequencies being different. In addition, buffering the amplified output signal may include inverting the amplified output signal.

DETAILED DESCRIPTION

Figure 1:
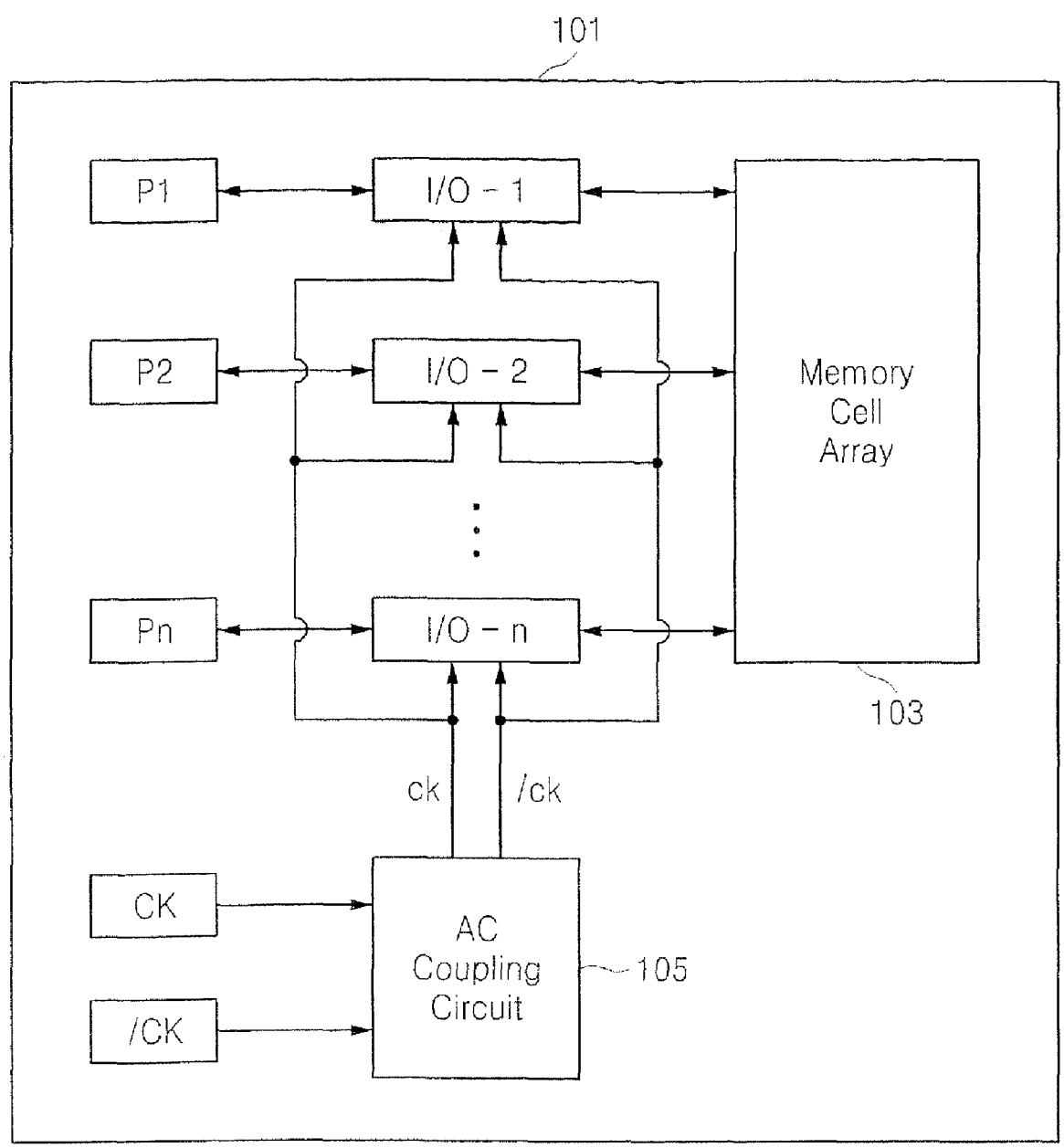
FIG. 1 is a block diagram illustrating an integrated circuit memory device including a memory cell array and an AC coupling circuit according to some embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. Like numbers refer to like elements throughout.

It will be understood that when an element is referred to as being "on", "connected to" or "coupled to" another element, it can be directly on, connected or coupled to the other element, or intervening elements may be present. In contrast, when an element is referred to as being "directly on," "directly connected to" or "directly coupled to" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

FIG. 1 is a block diagram illustrating an integrated circuit memory device 101 including a memory cell array 103 and an AC coupling circuit 105 according to some embodiments of the present invention. The memory cell array 103 may include a plurality of memory cells, for example, arranged in rows and columns, and each memory cell may be a dynamic memory cell, a static memory cell, a nonvolatile memory cell, etc. By way of example, the memory cell array may include an array of dynamic random access memory cells, an array of magnetic memory cells, an array of phase change memory cells, an array of flash memory cells, etc. While not shown separately, the memory cell array 103 may include additional elements such as a row decoder, a column decoder, amplifiers (such as sense amplifiers), buffers, etc.

The AC coupling circuit 105 may be coupled to differential clock signal input pads CK and /CK configured to receive differential clock signal inputs from outside the integrated circuit memory device 101. More particularly, the clock signal input pad CK may be configured to receive a clock signal CK, and the clock signal input pad /CK may be configured to receive an inverse of the clock signal CK. In response to the differential clock signals received at the pads CK and /CK, the AC coupling circuit may be configured to generate buffered differential clock signals ck and /ck.

The memory device 101 may also include a plurality of data input/output buffers I/O-1 to I/O-n coupled between respective data input/output pads P1 to Pn and the memory cell array 103. Moreover, each of the data input/output buffers I/O-1 to I/O-n may be configured to write and/or read data to and/or from the memory cell array 103 responsive to the buffered differential clock signals ck and /ck.

The AC coupling circuit 105 may be provided to buffer input differential clock signals received at pads CK and /CK so that an AC component of the input differential clock signals is passed through to the buffered differential clock signals ck and /ck, and so that DC and/or low frequency components of the input differential clock signals are reduced and/or blocked from the buffered differential clock signals ck and /ck. The AC coupling circuit 105 may also be configured to provide a consistent duty ratio (also referred to as a duty cycle) at different frequencies of the input differential clock signals. For example, the AC coupling circuit 105 may be configured to provide a consistent duty ratio of about 50% for the buffered differential clock signals ck and /ck at different frequencies of the input differential clock signals. The AC coupling circuit 105, for example, may provide buffered differential clock signals with reduced common mode offset, with reduced duty ratio distortion, with reduced noise sensitivity, and/or with reduced bias variation effect.

More particularly, the AC coupling circuit 105 may provide a consistent duty ratio (e.g., about a 50% duty ratio) at relatively high and low frequencies of the input differential clock signals. For example, the integrated circuit memory device 101 may be configured to operate at a relatively low frequency (with relatively low frequency input differential clock signals received at pads CK and /CK) and to operate at a relatively high frequency (with relatively high frequency differential input clock signals received at pads CK and /CK). The integrated circuit memory device 101 may be configured to provide relatively high frequency operations during normal read and/or write operations, and the integrated circuit memory device 101 may be configured to provide relatively low frequency operations to provide testing and/or backward compatibility. Different embodiments of the AC coupling circuit 105 of FIG. 1 will be discussed with respect to FIGS. 2, 6, 7, and 9 in greater detail below.

Figure 2:
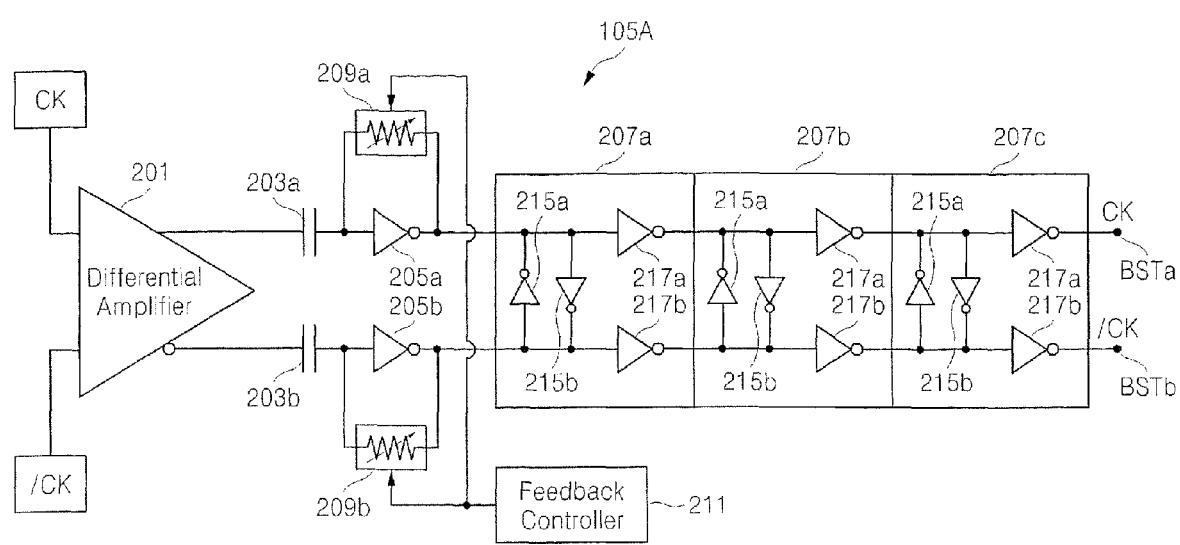
FIG. 2 is a schematic diagram of an AC coupling circuit according to some embodiments of the present invention.

FIG. 2 is a schematic diagram of an AC coupling circuit 105A according to some embodiments of the present invention. As shown in FIG. 2, the AC coupling circuit 105A may include: a differential amplifier 201; first and second capacitors 203a and 203b; first and second buffers 205a and 205b; and a plurality of latch circuits 207a, 207b, and 207c. In addition, first and second variable resistive feedback circuits 209a and 209b may be coupled between inputs and outputs of respective buffers 205a and 205b, and feedback controller 211 may be coupled to variable resistive feedback circuits 209a and 209b. As shown in FIG. 2, the buffers 205a and 205b may be respective inverters according to some embodiments of the present invention. Moreover, the capacitors 203a and 203b may be provided, for example, using metal on silicon (MOS) capacitors with a dielectric layer separating a metal or polysilicon electrode and a doped portion of a semiconductor substrate, using first and second polysilicon electrodes separated by a dielectric layer, using first and second metal electrodes separated by a dielectric layer, using a polysilicon electrode and a metal electrode separated by a dielectric layer, etc.

As discussed above with respect to FIG. 1, the clock signal input pad CK may be configured to receive a clock signal CK, and the clock signal input pad /CK may be configured to receive an inverse of the clock signal CK. As shown in FIG. 2, the inputs of the differential amplifier 201 are coupled to the clock signal input pads CK and /CK so that the differential clock signal input from outside the integrated circuit device is received at the differential amplifier. Moreover, the differential amplifier 201 is configured to differentially amplify the differential clock signal and to provide first and second differential output signals at respective first and second differential amplifier outputs.

The first and second capacitors 203a and 203b are respectively coupled between the first and second differential amplifier outputs of the differential amplifier 201 and inputs of the buffers 205a and 205b. Outputs of the buffers 205a and 205b are coupled to respective buffered signal output terminals BSTa and BSTb so that the buffered differential clock signals ck and /ck may be provided at the buffered signal output terminals BSTa and BSTb. As shown in FIG. 2, a plurality of latches 207a, 207b, and 207c may be coupled in series between outputs of the buffers 205a and 205b and the buffered signal output terminals BSTa and BSTb. While three latches are shown by way of example, any number of latches or no latches may be provided between the buffers 205a and 205b and the buffered signal output terminals BSTa and BSTb. According to some embodiments of the present invention, an odd number of latches may be provided. Moreover, each latch may include a pair of cross-coupled inverters 215a and 215b, and a pair of series inverters 217a and 217b.

Variable resistive feedback circuit 209a is thus configured to provide a variable resistance between the input and output of buffer 209a responsive to feedback controller 211, and variable resistive feedback circuit 209b is configured to provide a variable resistance between the input and output of buffer 205b responsive to feedback controller 211. More particularly, the feedback controller 211 may be configured to select a first resistance for each of the variable resistive feedback circuits 209a and 209b for a first frequency of the differential input clock signals, and to select a second resistance for each of the variable resistive feedback circuits 209a and 209b for a second frequency of the input signal, with the first and second frequencies being different and with the first and second resistances being different.

In particular, the feedback controller 211 may be configured to select relatively low resistances for the variable resistive feedback circuits 209a and 209b for relatively high frequencies, and to select relatively high resistances for the variable resistive feedback circuits 209a and 209b for relatively low frequencies. Accordingly, relatively strong feedback signals may be provided (using relatively low feedback resistances) through variable resistive feedback circuits 209a and 209b for relatively high frequencies, and relatively weak feedback signals may be provided (using relatively high feedback resistances) through variable resistive feedback circuits 209a and 209b for relatively low frequencies.

According to some embodiments of the present invention, each of the variable resistive circuits 209a and 209b may include a variable resistor. For example, each of the variable resistive circuits 209a and 209b may include a digitally controlled variable resistor responsive to digital inputs received from the feedback controller.

Figure 3:
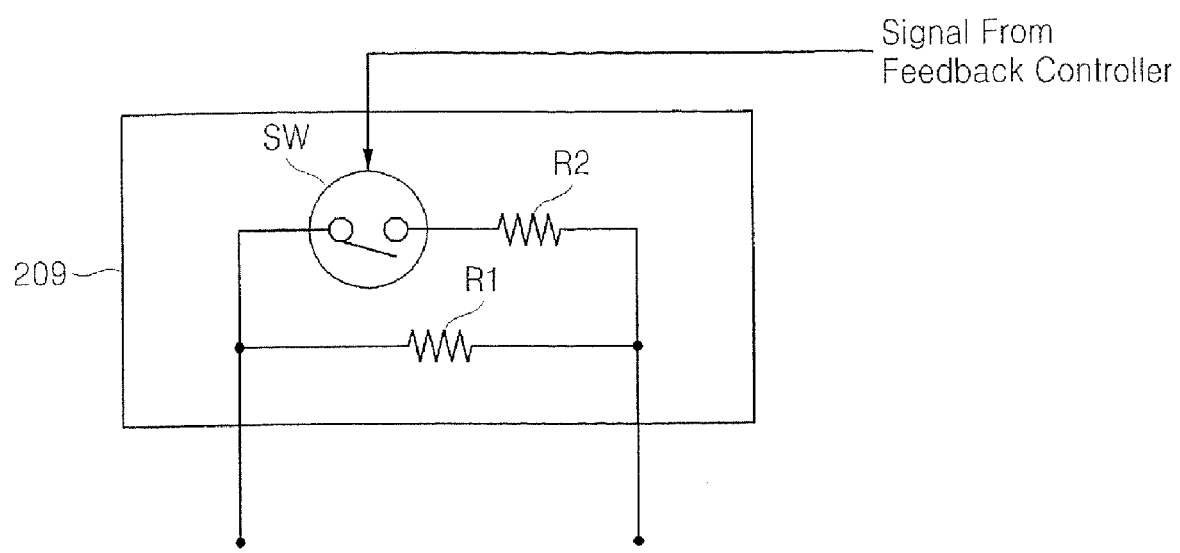
FIG. 3 is a schematic diagram of a variable resistive feedback circuit according to some embodiments of the present invention.

According to other embodiments of the present invention, each of the variable resistive feedback circuits 209a and 209b may include a plurality of parallel resistors with at least one of the resistors coupled in series with a switch operated in response to the feedback controller 211. As shown in FIG. 3, for example, a variable resistive feedback circuit 209 may include two resistors R1 and R2 electrically coupled in parallel and a switch SW coupled in series with resistor R2. Moreover, switch SW may be controlled responsive to signals from feedback controller 211. With switch SW closed, both resistors R1 and R2 are coupled in parallel to provide a relatively low resistance for variable resistive feedback circuit 209 for relatively high frequency signals. With switch SW open, only resistor R1 is coupled in the feedback path to provide a relatively high resistance for variable resistive feedback circuit 209 for relatively low frequency signals. According to other embodiments of the present invention, separate switches may be provided in series with each of the resistors R1 and R2 so that either of the resistors R1 or R2 may be switched in/out responsive to switch controls received from the feedback controller 211.

While the circuit 209 illustrated in FIG. 3 is provided by way of example, other circuit arrangements may be provided according to embodiments of the present invention. For example, a single resistor may be provided in series with a single switch so that a relatively low resistance (equal to the resistance of the resistor) is provided when the switch is closed and a relatively high resistance (approximately infinite resistance) is provided when the switch is open. According to other embodiments of the present invention, a first switch may be coupled in series with the resistor R1 and a second switch may be coupled in series with the resistor R2 (different than the resistor R1) so that a resistance of the circuit 209 is determined by the resistor R1 when the first switch is closed and the second switch is opened, and so that a resistance of the circuit 209 is determined by the resistor R2 when the first switch is opened and the second switch is closed. According to still further embodiments of the present invention, any number of levels of resistive granularity may be provided by the circuit 209 by providing additional resistors coupled in parallel with additional switches coupled in series with the respective additional resistors. Resistors of the circuit 209 may be provided, for example, using doped polysilicon resistors, metal resistors, resistors patterned from an active region of a semiconductor substrate, resistors patterned from an n-well of a semiconductor substrate, etc.

Implementing each of the variable resistive feedback circuits 209a and 209b of FIG. 2 using the circuit 209 of FIG. 3 including parallel resistors R1 and R2 and switch SW, the feedback controller 211 may generate a frequency control flag (having a logic value of one or zero). The switch SW of FIG. 3, for example, may be a PMOS (P-channel Metal Oxide Semiconductor) transistor.

Figure 4A:
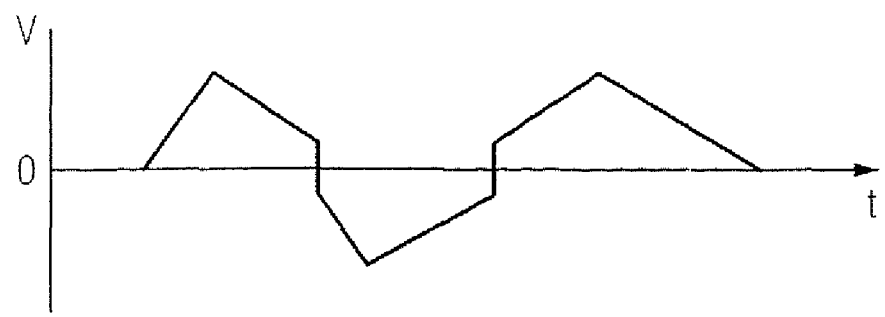
FIGS. 4A and 4B are graphs illustrating simulations of high and low frequency operations of the AC coupling circuit of FIG. 2 according to some embodiments of the present invention.

At relatively high differential clock signal frequencies, the feedback controller 211 may generate a frequency control flag having the logic zero level (or low voltage logic level) to close the switch SW thereby reducing resistances provided by the variable resistive feedback circuits 209a and 209b. Accordingly, a relatively low resistance feedback path may be provided through the parallel combination of resistors R1 and R2 of the circuit 209 to increase a strength of the feedback path at relatively high frequencies. FIG. 4A is a graph illustrating simulation of an output signal of buffer 205b resulting for the relatively high frequency differential clock signal for the AC coupling circuit 105A of FIG. 2 implemented using the circuit 209 of FIG. 3 for each of the variable resistive feedback circuits 209a and 209b. An output signal of buffer 205b will be the inverse of that illustrated in FIG. 4A.

Figure 4B:
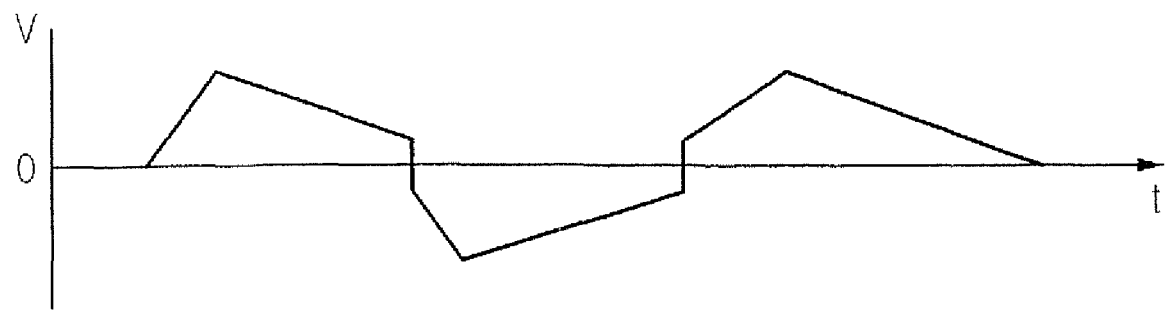

At relatively low differential clock signal frequencies, the feedback controller 211 may generate a frequency control flag having the logic one level (or high voltage logic level) to open the switch SW thereby increasing resistances provided by the variable resistive feedback circuits 209a and 209b. Accordingly, a relatively high resistance feedback path may be provided through only resistor R1 of the circuit 209 to reduce a strength of the feedback path at relatively low frequencies. FIG. 4B is a graph illustrating simulation of an output signal of buffer 205b resulting for the relatively low frequency differential clock signal for the AC coupling circuit 105A of FIG. 2 implemented using the circuit 209 of FIG. 3 for each of the variable resistive feedback circuits 209a and 209b. An output signal of buffer 205b will be the inverse of that illustrated in FIG. 4B. Scales of the horizontal axis (time) and the vertical axis (voltage) are the same in FIGS. 4A and 4B.

Figure 5:
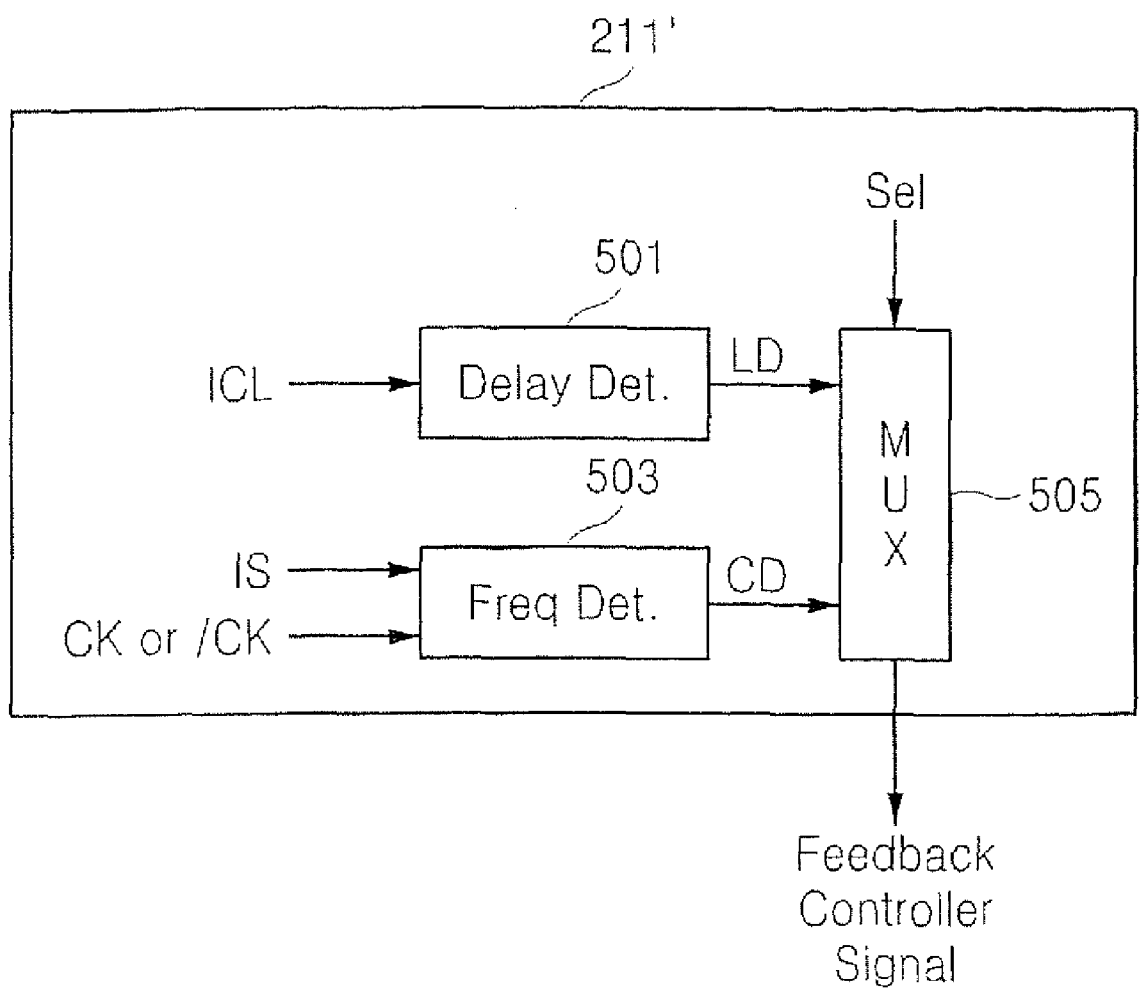
FIG. 5 is a block diagram illustrating a feedback controller according to some embodiments of the present invention.

FIG. 5 is a block diagram illustrating an example of a feedback controller 211' that may be implemented as the feedback controller 211 of FIG. 2 according to some embodiments of the present invention. In particular, the feedback controller 211' of FIG. 5 may be configured to generate frequency control flags as discussed above with respect to FIG. 3. In particular, the feedback controller 211' may include a delay detector 501, a frequency detector 503, and/or a multiplexer 505. With both a delay detector 501 and a frequency detector 503, the multiplexer 505 may be configured to select the flag signal LD generated by the delay detector 501 or the flag signal CD generated by the frequency detector 503 responsive to a selection signal Se1. In an integrated circuit memory device, for example, the selection signal Se1. may be a test mode register set signal (TMRS). The multiplexer 505 may be omitted, however, if the feedback controller signal is generated using a delay detector 501 only (without using a frequency detector) or if the feedback control signal is generated using a frequency detector 503 only (without using a delay detector).

In an integrated circuit memory device, for example, the delay detector 501 may receive CAS (column address strobe) latency information ICL. More particularly, a CAS latency (included in the CAS latency information ICL) may define a delay from a time of a data request to a time of a first data output, and the CAS latency may be compared to a reference to determine whether the differential clock signal input has a relatively low or high frequency. If the CAS latency is less than the reference, the differential input clock signal may be determined to have a high frequency, and the flag signal LD having the logic zero level (or low voltage logic level) may be generated. If the CAS latency is greater than the reference, the differential input clock signal may be determined to have a low frequency, and the flag signal LD having the logic one level (or high voltage logic level) may be generated.

The frequency detector 503 may be configured to receive one of the differential input clock signals (received at CK or /CK) and an input reference signal IS defining a limit frequency. If a frequency of the input clock signal is greater than the limit frequency, the differential input clock signal may be determined to have a high frequency, and the flag signal CD having the logic zero level (or low logic level) may be generated. If a frequency of the input clock signal is less than the limit frequency, the differential input clock signal may be determined to have a high frequency, and the flag signal CD having the logic one level (or high logic level) may be generated.

Figure 6:
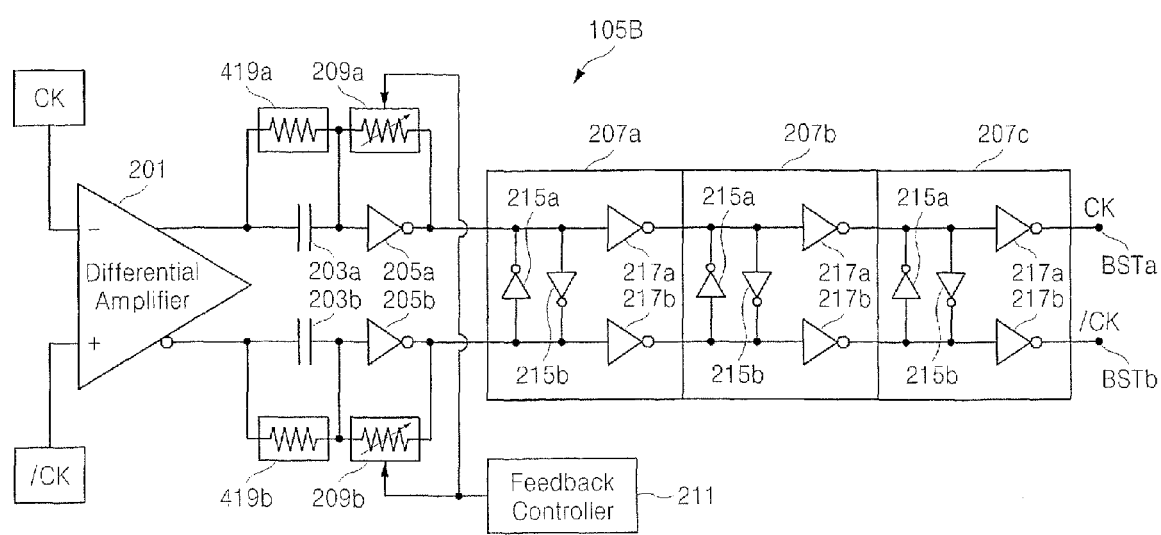
FIG. 6 is a schematic diagram of an AC coupling circuit according to some other embodiments of the present invention.

FIG. 6 is a schematic diagram of an AC coupling circuit 105B according to some other embodiments of the present invention. Elements of the AC coupling circuit 105B of FIG. 6 are the same as those discussed above with respect to the AC coupling circuit 105A of FIG. 2 with the addition of resistive feedback circuits 419a and 419b coupled between terminals of capacitors 203a and 203b, respectively.

According to some embodiments of the present invention, the resistive feedback circuits 419a and 419b may provide respective fixed resistances. According to other embodiments of the present invention, the resistive feedback circuits 419a and 419b may provide respective variable resistances responsive to the feedback controller 211. For example, the feedback controller 211 may be configured to select one resistance for the resistive feedback circuits 419a and 419b for the first frequency of the differential clock signal, and to select another different resistance for the resistive feedback circuits 419a and 419b for the second frequency of the differential clock signal. Stated in other words, resistances of the resistive feedback circuits 419a and 419b may change for different differential clock signal frequencies, and resistances of the resistive feedback circuits 209a and 209b may change for different differential clock signal frequencies.

Figure 7:
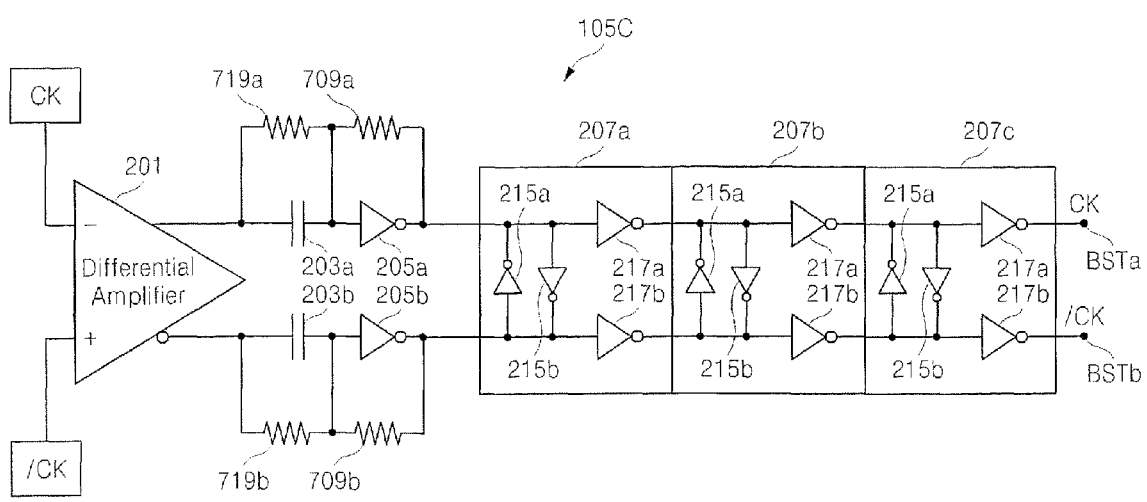
FIG. 7 is a schematic diagram of an AC coupling circuit according to still other embodiments of the present invention.

FIG. 7 is a schematic diagram of an AC coupling circuit 105C according to some other embodiments of the present invention. Elements of the AC coupling circuit 105C of FIG. 7 are the same as those discussed above with respect to the AC coupling circuits 105A and 105B of FIGS. 2 and 6 where the elements of the AC coupling circuit 105C are identified using reference numbers that were used to identify the same elements in AC coupling circuits 105A and 105B. In the AC coupling circuit 105C of FIG. 7, however, feedback resistors 709a and 709b may be coupled between terminals of buffers 205a and 205b, respectively, and feedback resistors 719a and 719b may be coupled between terminals of capacitors 203a and 203b, respectively.

According to some embodiments of the present invention, the feedback resistors 719a and 719b may provide respective fixed resistances. According to other embodiments of the present invention, the feedback resistors 719a and 719b may provide respective variable resistances responsive to a feedback controller as discussed above with respect to FIG. 6. For example, a feedback controller may be configured to select one resistance for the feedback resistors 719a and 719b for the first frequency of the differential clock signal, and to select another different resistance for the feedback resistors 719a and 719b for the second frequency of the differential clock signal. Stated in other words, resistances of the feedback resistors 719a and 719b may change for different differential clock signal frequencies, and resistances of the feedback resistors 709a and 709b may remain fixed for different differential clock signal frequencies.

According to some embodiments of the present invention, the feedback resistors 709a and 709b may provide respective fixed resistances. According to other embodiments of the present invention, the feedback resistors 709a and 709b may provide respective variable resistances responsive to a feedback controller as discussed above with respect to FIG. 2. For example, a feedback controller may be configured to select one resistance for the feedback resistors 709a and 709b for the first frequency of the differential clock signal, and to select another different resistance for the feedback resistors 709a and 709b for the second frequency of the differential clock signal. Stated in other words, resistances of the feedback resistors 709a and 709b may change for different differential clock signal frequencies, and resistances of the feedback resistors 719a and 719b may remain fixed for different differential clock signal frequencies.

Figure 8A:
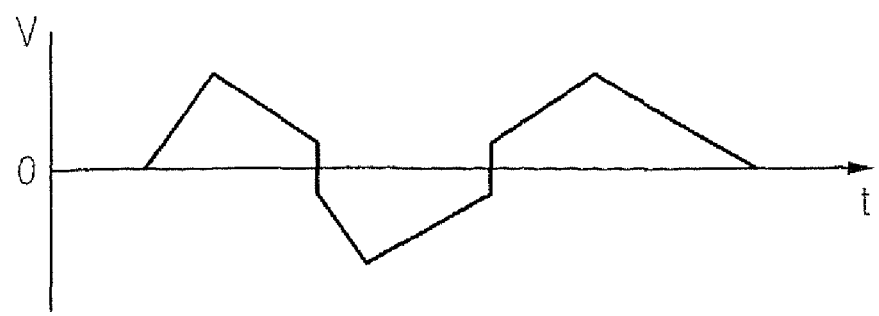
FIGS. 8A and 8B are graphs illustrating simulations of high and low frequency operations of the AC coupling circuit of FIG. 7 according to some embodiments of the present invention.
Figure 8B:
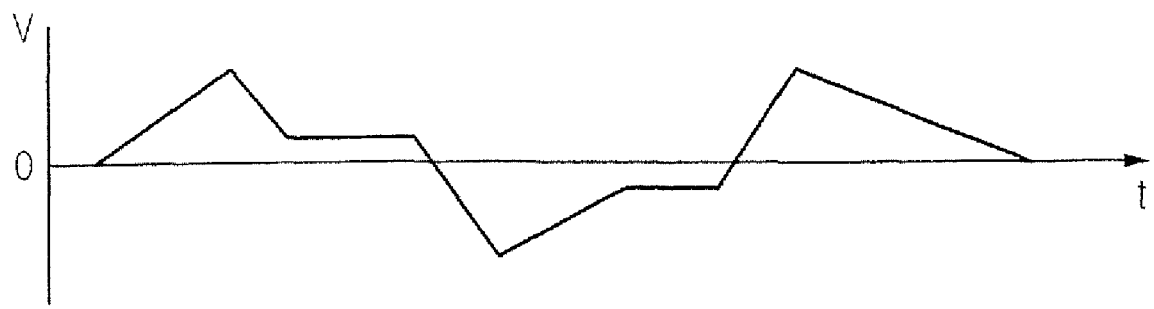

FIGS. 8A and 8B are graphs illustrating simulations of high and low frequency operations of the AC coupling circuit of FIG. 7 using fixed feedback resistors 709a, 709b, 719a, and 719b. More particularly, FIG. 8A is a graph illustrating simulation of an output signal of buffer 205b of FIG. 7 resulting for a relatively high frequency differential clock signal for the AC coupling circuit 105C of FIG. 7. An output signal of buffer 205b will be the inverse of that illustrated in FIG. 8A. FIG. 8B is a graph illustrating simulation of an output signal of buffer 205b of FIG. 7 resulting for a relatively low frequency differential clock signal for the AC coupling circuit 105C of FIG. 7. An output signal of buffer 205b will be the inverse of that illustrated in FIG. 8B. Scales of the horizontal axis (time) and the vertical axis (voltage) are the same in FIGS. 8A and 8B.

Figure 9:
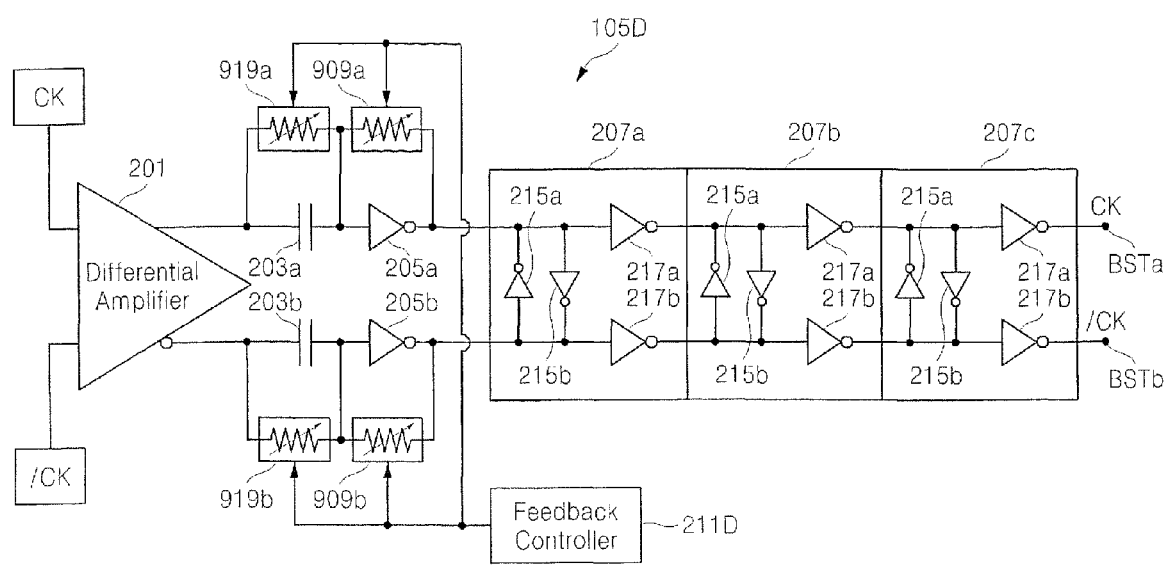
FIG. 9 is a schematic diagram of an AC coupling circuit according to yet other embodiments of the present invention.

FIG. 9 is a schematic diagram of an AC coupling circuit 105D according to yet other embodiments of the present invention. Elements of the AC coupling circuit 105D of FIG. 9 are the same as those discussed above with respect to the AC coupling circuits 105A, 105B, and 105C of FIGS. 2, 6, and 7 where the elements of the AC coupling circuit 105D are identified using reference numbers that were used to identify the same elements in AC coupling circuits 105A, 105B, and 105C. In the AC coupling circuit 105D of FIG. 9, however, variable resistive feedback circuits 909a and 909b are coupled between terminals of buffers 205a and 205b, respectively, and variable resistive feedback circuits 919a and 919b are coupled between terminals of capacitors 203a and 203b, respectively. Moreover, different resistances of the variable resistive feedback circuits 909a, 909b, 919a, and 919b may be provided for different frequencies of differential input clock signals received at inputs CK and /CK responsive to feedback controller 211.

The variable resistance feedback circuits 909a and 909b may operate under control of the feedback controller 211D as discussed above with respect to the variable resistance feedback circuits 209a and 209b and feedback controller 211 of FIG. 2. The variable resistance feedback circuits 909a and 909b may thus provide relatively low feedback resistances at relatively high frequencies and relatively high feedback resistances at relatively low frequencies.

Variable resistance feedback circuits 919a and 919b may operate responsive to the same signal of feedback controller 211D used to control variable resistance feedback circuits 909a and 909b, or feedback controller 211D may be configured to provide separate control signals for variable resistance feedback circuits 919a and 919b different than control signals for variable resistance feedback circuits 909a and 909b. According to some embodiments of the present invention, feedback controller 211D may be configured to control variable resistance feedback circuits 909a and 909b using a first control flag and to control variable resistance feedback circuits 919a and 919b using a second control flag.

According to some embodiments of the present invention, the AC coupling circuit 105D of FIG. 9 may be configured to support three different frequencies of signals received at inputs CK and /CK. At a first relatively high frequency, variable resistance feedback circuits 919a and 919b may be configured to provide a first (relatively low) resistance, and variable resistance feedback circuits 909a and 909b may be configured to provide a second (relatively low) resistance. At a second intermediate frequency, variable resistance feedback circuits 919a and 919b may be configured to provide a third (relatively high) resistance, and variable resistance feedback circuits 909a and 909b may be configured to provide the second (relatively low) resistance. At a third relatively low frequency, variable resistance feedback circuits 919a and 919b may be configured to provide the third (relatively high) resistance, and variable resistance feedback circuits 909a and 909b may be configured to provide a fourth (relatively high) resistance. At relatively low frequencies, the buffer feedback circuits 909a and 909b and the capacitor feedback circuits 919a and 919b may be configured to provide relatively high resistances, and a relatively high frequencies, the buffer feedback circuits 909a and 909b and the capacitor feedback circuits 919a and 919b may be configured to provide relatively low resistances. At intermediate frequencies, however, the buffer feedback circuits 909a and 909b may be configured to provide relatively low resistances while capacitor feedback circuits 919a and 919b may be configured to provide relatively high resistances.

Each of the variable resistance feedback circuits 909a, 909b, 919a, and 919b may be implemented using a digitally controlled variable resistor responsive to digital inputs received from the feedback controller 211D. According to other embodiments of the present invention, each of the variable resistance feedback circuits 909a, 909b, 919a, and 919b may be implemented using a switched parallel resistor circuit as discussed above with respect to FIG. 3 operating responsive to signals received from feedback controller 211D.

While the AC coupling circuits 105A and 105A' of FIGS. 2, 6, 7, and 9 are discussed in the context of AC coupling buffers for differential clock signals for integrated circuit memory devices, the AC coupling circuits 105A, 105B, 105C, and 105D of FIGS. 2, 6, 7, and 9 may be used to differentially amplify any AC signal.

While the present invention has been particularly shown and described with reference to embodiments thereof, it will be understood by those of ordinary skill in the art that various changes in form and details may be made therein without departing from the spirit and scope of the present invention as defined by the following claims.

That which is claimed is:

1. An integrated circuit device comprising:
    an amplifier including an amplifier input configured to receive an input signal wherein the amplifier is configured to provide an amplifier output signal at an amplifier output responsive to the input signal received at the amplifier input;
    a capacitor coupled to the amplifier output;
    a buffer coupled to the capacitor so that the capacitor is coupled in series between the amplifier output and an input of the buffer, wherein an output of the buffer is coupled to a buffered signal terminal;
    a variable resistive feedback circuit coupled between the input and output of the buffer wherein the variable resistive feed back circuit provides a variable resistance between the input and output of the buffer; and
    a feedback resistance controller coupled to the variable resistive feedback circuit wherein the feedback resistance controller is configured to select a first resistance for the variable resistive feedback circuit for a first frequency of the input signal and to select a second resistance for the variable resistive feedback circuit for a second frequency of the input signal different than the first frequency wherein the first and second resistances are different.

2. An integrated circuit device according to claim 1 wherein the amplifier comprises a differential amplifier, wherein the amplifier output signal comprises a first differential amplifier output signal, wherein the amplifier output comprises a first differential amplifier output, wherein the differential amplifier is configured to provide the first differential amplifier output signal and a second differential amplifier output signal respectively at the first differential amplifier output and at a second differential amplifier output responsive to the input signal received at the amplifier input, wherein the capacitor comprises a first capacitor, wherein the buffer comprises a first buffer, wherein the variable resistive feedback circuit comprises a first variable resistive feedback circuit, and wherein the buffered signal terminal comprises a first buffered signal terminal, the integrated circuit device further comprising:
    a second capacitor coupled to the second differential amplifier output;
    a second buffer coupled to the second capacitor so that the second capacitor is coupled in series between the second differential amplifier output and an input of the second buffer, wherein an output of the second buffer is coupled to a second buffered signal terminal; and
    a second variable resistive feedback circuit coupled between the input and output Of the second buffer wherein the second variable resistive feed back circuit provides a variable resistance between the input and output of the second buffer;
    wherein the feedback resistance controller is coupled to the first and second variable resistive feedback circuits wherein the feedback resistance controller is configured to select a third resistance for the second variable resistive feedback circuit for the first frequency of the input signal and to select a fourth resistance for the second variable resistive feedback circuit for the second frequency of the input signal wherein the third and fourth resistances are different.

3. An integrated circuit device according to claim 2 wherein the amplifier input comprises a first differential amplifier input, wherein the differential amplifier comprises a second differential amplifier input, and wherein the first and second differential amplifier inputs are configured to receive complimentary differential clock signals.

4. An integrated circuit device according to claim 1 further comprising:
    a signal input pad configured to receive the input signal from outside the integrated circuit device, wherein the amplifier input is coupled to the signal input pad.

5. An integrated circuit device according to claim 4 wherein the signal input pad comprises a clock signal input pad, and wherein the input signal comprises an input clock signal received from outside the integrated circuit device so that a buffered clock signal is provided at the buffered signal terminal.

6. An integrated circuit device according to claim 5 further comprising:
    a memory cell array including a plurality of memory cells; and
    a plurality of data input/output buffers coupled between respective data input/output pads and the memory cell array, wherein each of the data input/output buffers is configured to write and/or read data to and/or from the memory cell array responsive to the buffered clock signal.

7. An integrated circuit device according to claim 1 wherein the first resistance is lower than the second resistance and wherein the first frequency is higher than the second frequency.

8. An integrated circuit device according to claim 1 further comprising:
   a second resistive feedback circuit coupled between terminals of the capacitor.

9. An integrated circuit device according to claim 8 wherein the second resistive feedback circuit comprises a second variable resistive feedback circuit providing a variable feedback resistance between terminals of the capacitor, and wherein the feedback resistance controller is coupled to the second variable resistive feedback circuit, wherein the feedback resistance controller is configured to select a third resistance for the second variable resistive feedback circuit for the first frequency of the input signal and to select a fourth resistance for the second variable resistive feedback circuit for the second frequency of the input signal wherein the third and fourth resistances are different.

10. An integrated circuit device according to claim 1 wherein the buffer comprises an inverter.

11. An integrated circuit device according to claim 1 further comprising:
   a latch coupled in series between the output of the buffer and the buffered signal terminal.

12. An integrated circuit device according to claim 1 wherein the variable resistive circuit comprises a variable resistor.

13. An integrated circuit device according to claim 1 wherein the variable resistive circuit comprises a first resistor coupled between the input and output of the buffer and a switch coupled in series with a second resistor between the input and output of the buffer, and wherein the switch is configured to couple and decouple the second resistor responsive to the feedback resistance controller.

14. An integrated circuit device comprising:
   an amplifier including an input configured to receive an input signal wherein the amplifier is configured to provide an amplifier output signal at an amplifier output responsive to the input signal received at the amplifier input;
   a capacitor coupled to the amplifier output;
   a buffer coupled to the capacitor so that the capacitor is coupled in series between the amplifier output and an input of the buffer, wherein an output of the buffer is coupled to a buffered signal terminal; and
   a resistive feedback circuit coupled between terminals of the capacitor.

15. An integrated circuit device according to claim 14 wherein the amplifier comprises a differential amplifier, wherein the amplifier output signal comprises a first differential amplifier output signal, wherein the amplifier output comprises a first differential amplifier output, wherein the differential amplifier is configured to provide the first differential amplifier output signal and a second differential amplifier output signal respectively at the first differential amplifier output and at a second differential amplifier output responsive to the input signal received at the amplifier input, wherein the capacitor comprises a first capacitor, wherein the buffer comprises a first buffer, wherein the resistive feedback circuit comprises a first variable resistive feedback circuit, and wherein the buffered signal terminal comprises a first buffered signal terminal, the integrated circuit device further comprising:
   a second capacitor coupled to the second differential amplifier output;
   a second buffer coupled to the second capacitor so that the second capacitor is coupled in series between the second differential amplifier output and an input of the second buffer, wherein an output of the second buffer is coupled to the buffered signal terminal; and
   a second variable resistive feedback circuit coupled between terminals of the second capacitor.

16. An integrated circuit device according to claim 15 wherein the amplifier input comprises a first differential amplifier input, wherein the differential amplifier comprises a second differential amplifier input, and wherein the first and second differential amplifier inputs are configured to receive complimentary differential clock signals.

17. An integrated circuit device according to claim 14 further comprising:
   a signal input pad configured to receive an input signal from outside the integrated circuit device, wherein the amplifier input is coupled to the signal input pad.

18. An integrated circuit device according to claim 17 wherein the signal input pad comprises a clock signal input pad, and wherein the input signal comprises an input clock signal received from outside the integrated circuit device so that a buffered clock signal is provided at the buffered signal terminal.

19. An integrated circuit device according to claim 18 further comprising:
   a memory cell array including a plurality of memory cells; and
   a plurality of data input/output buffers coupled between respective data input/output pads and the memory cell array, wherein each of the data input/output buffers is configured to write and/or read data to and/or from the memory cell array responsive to the buffered clock signal.

20. An integrated circuit device according to claim 14 wherein the resistive feedback circuit comprises a variable resistive feedback circuit, the device further comprising:
   a feedback resistance controller coupled to the variable resistive feedback circuit wherein the feedback resistance controller is configured to select a first resistance for the variable resistive feedback circuit for a first frequency of the input signal and to select a second resistance for the variable resistive feedback circuit for a second frequency of the input signal different than the first frequency wherein the first and second resistances are different.

21. An integrated circuit device according to claim 14 further comprising:
   a variable resistive feedback circuit coupled between the input and output of the buffer wherein the variable resistive feed back circuit provides a variable resistance between the input and output of the buffer; and
   a feedback resistance controller coupled to the variable resistive feedback circuit wherein the feedback resistance controller is configured to select a first resistance for the variable resistive feedback circuit for a first frequency of the input signal and to select a second resistance for the variable resistive feedback circuit for a second frequency of the input signal different than the first frequency wherein the first and second resistances are different.

22. An integrated circuit device according to claim 21 wherein the first resistance is lower than the second resistance and wherein the first frequency is higher than the second frequency.

23. An integrated circuit device according to claim 14 wherein the buffer comprises an inverter.

24. An integrated circuit device according to claim 14 further comprising:
   a latch coupled in series between the output of the buffer and the buffered signal terminal.

25. A method of operating an integrated circuit device, the method comprising:
   amplifying an input signal to provide an amplified output signal;
   coupling the amplified output signal to an input terminal of a capacitor;
   buffering the amplified output signal at an output terminal of the capacitor to provide a buffered output signal; and
   providing a variable resistive feedback path for the buffered output signal to the output terminal of the capacitor wherein a resistance of the variable resistive feedback path is different for different frequencies of the input signal.

26. A method of operating an integrated circuit device, the method comprising:
   amplifying an input signal to provide an amplifier output signal;
   coupling the amplified output signal to an input terminal of a capacitor;
   buffering the amplified output signal at an output terminal of the capacitor to provide a buffered output signal; and
   providing a resistive feedback path between terminals of the capacitor.

* * * * *